(12) United States Patent
Hong et al.

(10) Patent No.: US 10,002,967 B2
(45) Date of Patent: Jun. 19, 2018

(54) SEMICONDUCTOR DEVICES HAVING FIN-SHAPED PATTERNS WITH INFLECTION POINTS

(71) Applicant: Samsung Electronics Co., Ltd., Suwon-si, Gyeonggi-do (KR)

(72) Inventors: Seung Soo Hong, Incheon (KR); Jeong Yun Lee, Yongin-si (KR); Kyung Seok Min, Yongin-si (KR); Seung Ju Park, Hwaseong-si (KR); Geum Jung Seong, Seoul (KR); Bo Ra Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/602,131

(22) Filed: May 23, 2017

(65) Prior Publication Data

US 2018/0069125 A1    Mar. 8, 2018

(30) Foreign Application Priority Data

Sep. 2, 2016   (KR) ........................ 10-2016-0112897

(51) Int. Cl.
*H01L 21/70*   (2006.01)
*H01L 29/78*   (2006.01)
*H01L 29/06*   (2006.01)

(52) U.S. Cl.
CPC ...... *H01L 29/7855* (2013.01); *H01L 29/0611* (2013.01); *H01L 29/0657* (2013.01)

(58) Field of Classification Search
CPC ............. H01L 29/7855; H01L 29/0611; H01L 29/0657; H01L 21/823431; H01L 21/823821; H01L 27/0886; H01L 27/0924; H01L 27/10879; H01L 29/41791; H01L 21/76; H01L 21/76283; H01L 27/088
USPC ........ 257/288, 368, 369, 501, 506; 438/151, 438/196, 197, 199, 218
See application file for complete search history.

(56) References Cited

U.S. PATENT DOCUMENTS

| | | |
|---|---|---|
| 8,405,155 B2 | 3/2013 | Yeh et al. |
| 8,709,897 B2 | 4/2014 | Sung et al. |
| 8,796,759 B2 | 8/2014 | Perng et al. |
| 9,034,700 B1 | 5/2015 | Jeong et al. |
| 9,093,466 B2 | 7/2015 | Pei et al. |
| 9,184,290 B2 | 11/2015 | Cheng et al. |
| 2014/0361368 A1 | 12/2014 | Kerber |

(Continued)

FOREIGN PATENT DOCUMENTS

KR    10-0906648    7/2009

*Primary Examiner* — Shahed Ahmed
(74) *Attorney, Agent, or Firm* — Myers Bigel, P.A.

(57) ABSTRACT

Semiconductor devices as described herein may include a fin-shaped pattern extending in a first direction, first and second side walls facing each other, first and second gate electrodes extending in a second direction and spaced apart from each other, a first gate spacer that is on a side wall of the first gate electrode, a second gate spacer that is on a side wall of the second gate electrode, a first trench in the fin-shaped pattern that is between the first and second gate electrodes and having a first width, and a second trench in the fin-shaped pattern that is below the first trench and has a second width smaller than the first width. The fin-shaped pattern may include first and second inflection points on the side walls of the fin-shaped pattern, and a bottom surface of the second trench may be lower than the inflection points.

13 Claims, 14 Drawing Sheets

(56) References Cited

U.S. PATENT DOCUMENTS

| | | | |
|---|---|---|---|
| 2015/0214366 A1* | 7/2015 | Chang | H01L 29/7848 |
| | | | 257/192 |
| 2015/0325575 A1* | 11/2015 | Park | H01L 29/0653 |
| | | | 257/401 |
| 2016/0027902 A1 | 1/2016 | Yoon et al. | |
| 2016/0093737 A1 | 3/2016 | Li et al. | |
| 2017/0098708 A1* | 4/2017 | Shen | H01L 29/7848 |
| 2017/0179138 A1* | 6/2017 | Hsu | H01L 27/11206 |

\* cited by examiner

SEMICONDUCTOR DEVICES HAVING FIN-SHAPED PATTERNS WITH INFLECTION POINTS

CROSS-REFERENCE TO RELATED APPLICATION

This application claims priority from Korean Patent Application No. 10-2016-0112897 filed on Sep. 2, 2016 in the Korean Intellectual Property Office, the disclosure of which is incorporated herein by reference in its entirety.

BACKGROUND

1. Technical Field

Aspects of the present disclosure relate to a semiconductor device. More particularly, the present disclosure relates to a semiconductor device that includes a fin-shaped pattern.

2. Description of Related Art

In one scaling technique for enhancing the density of the semiconductor device, a multi-gate transistor in which a fin-shaped silicon body is formed on a substrate and a gate is formed on a surface of the silicon body is suggested. Because such a multi-gate transistor utilizes a 3-dimensional channel, it is easily scaled. Further, even if a gate length of the multi-gate transistor is not increased, it is possible to improve the current control capability. Furthermore, it is possible to effectively suppress a short channel effect (SCE) in which the potential of the channel region is influenced by drain voltage.

SUMMARY

Aspects of the present disclosure provide semiconductor devices that are capable of improving elemental characteristics, by forming an epitaxial trench structure with a secondary recess profile, to reduce an overlap between the gate electrode and the epitaxial layer.

According to an aspect of the present disclosure, there is provided a semiconductor device including a fin-shaped pattern that extends in a first direction, and comprises first and second side walls facing each other, a first gate electrode and a second gate electrode that extend in a second direction different from the first direction, and are spaced apart from each other, a first gate spacer that is on a side wall of the first gate electrode, a second gate spacer that is on a side wall of the second gate electrode, a first trench that is between the first gate electrode and the second gate electrode to have a first width in the fin-shaped pattern, and a second trench that is below the first trench to have a second width smaller than the first width in the fin-shaped pattern, wherein the fin-shaped pattern comprises a first inflection point on the first side wall, and a second inflection point on the second side wall, and a bottom surface of the second trench is to be lower than the first and second inflection points.

According to another aspect of the present disclosure, there is provided a semiconductor device including a fin-shaped pattern that extends in a first direction, and comprises first and second side walls facing each other, a first gate electrode and a second gate electrode that extend in a second direction different from the first direction, and are spaced apart from each other, a first gate spacer that is on a side wall of the first gate electrode, and comprises a first sub-gate spacer on the first side wall of the fin-shaped pattern, and a second sub-gate spacer on the second side wall of the fin-shaped pattern, a first trench that is between the first gate electrode and the second gate electrode to have a first width in the fin-shaped pattern, and a second trench that is below the first trench to have a second width smaller than the first width in the fin-shaped pattern, wherein a first interval between the first sub-gate spacer and the second sub-gate spacer measured in the second direction is to be greater than a second interval between the first side wall and the second side wall of the fin-shaped pattern measured in the second direction within the same plane.

According to another aspect of the present disclosure, there is provided a semiconductor device including a fin-shaped pattern extending in a first direction and comprising a first side wall and a second side wall. The semiconductor device may include a first gate electrode and a second gate electrode extending in a second direction different from the first direction and spaced apart from each other. The semiconductor device may include a first gate spacer on a side wall of the first gate electrode and a second gate spacer on a side wall of the second gate electrode, and a trench in the fin-shaped pattern between the first gate electrode and the second gate electrode. The trench may have a stepped profile. The trench may include a first portion having a first width and a second portion below the first portion having a second width smaller than the first width. The fin-shaped pattern may include a first inflection point on the first side wall of the fin-shaped pattern, and a second inflection point on the second side wall of the fin-shaped pattern, and a bottom surface of the second portion of the trench may be lower than the first and second inflection points.

Other aspects of the present disclosure which were not mentioned in the present summary will become more apparent to one of ordinary skill in the art by referencing the detailed description given below.

BRIEF DESCRIPTION OF THE DRAWINGS

The above and other aspects and features of the present disclosure will become more apparent through review of the detailed description with reference to the attached drawings, in which.

DETAILED DESCRIPTION

Hereinafter, semiconductor devices according to aspects of the present disclosure will be described with reference to FIGS. 1 to 14.

Figure 1:
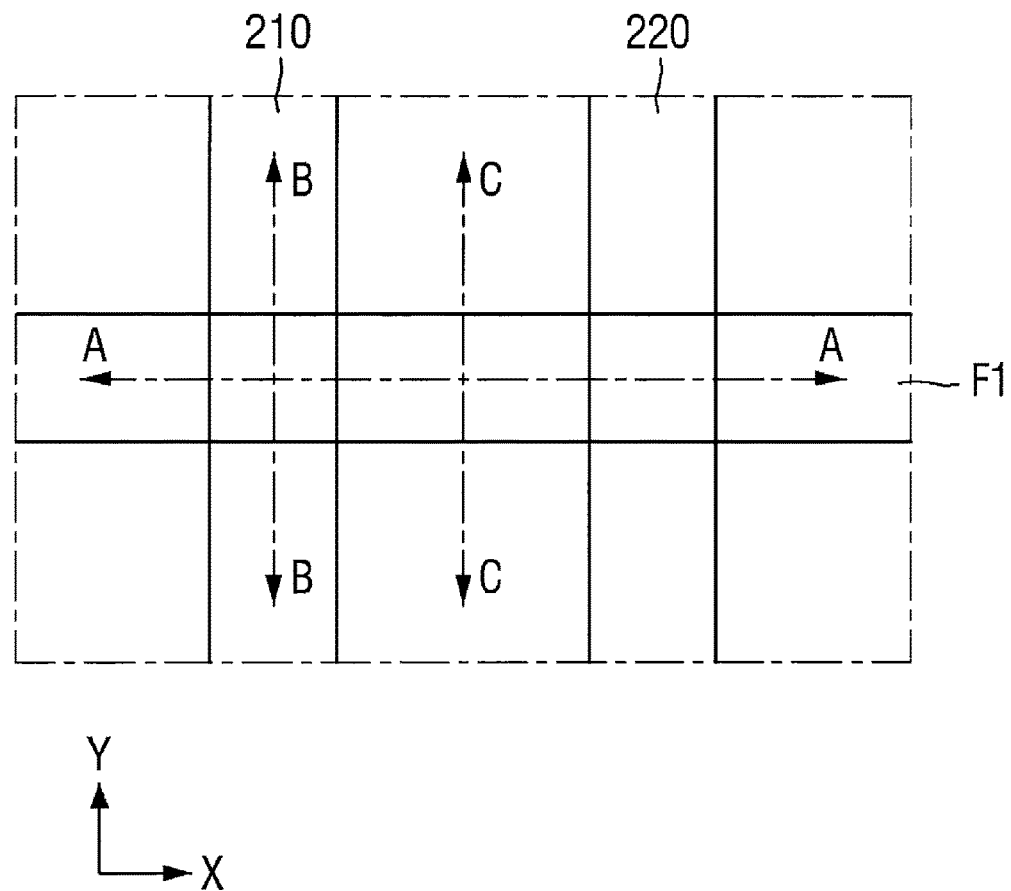
FIG. 1 is a layout diagram illustrating a semiconductor device according to aspects of the present disclosure.
Figure 2:
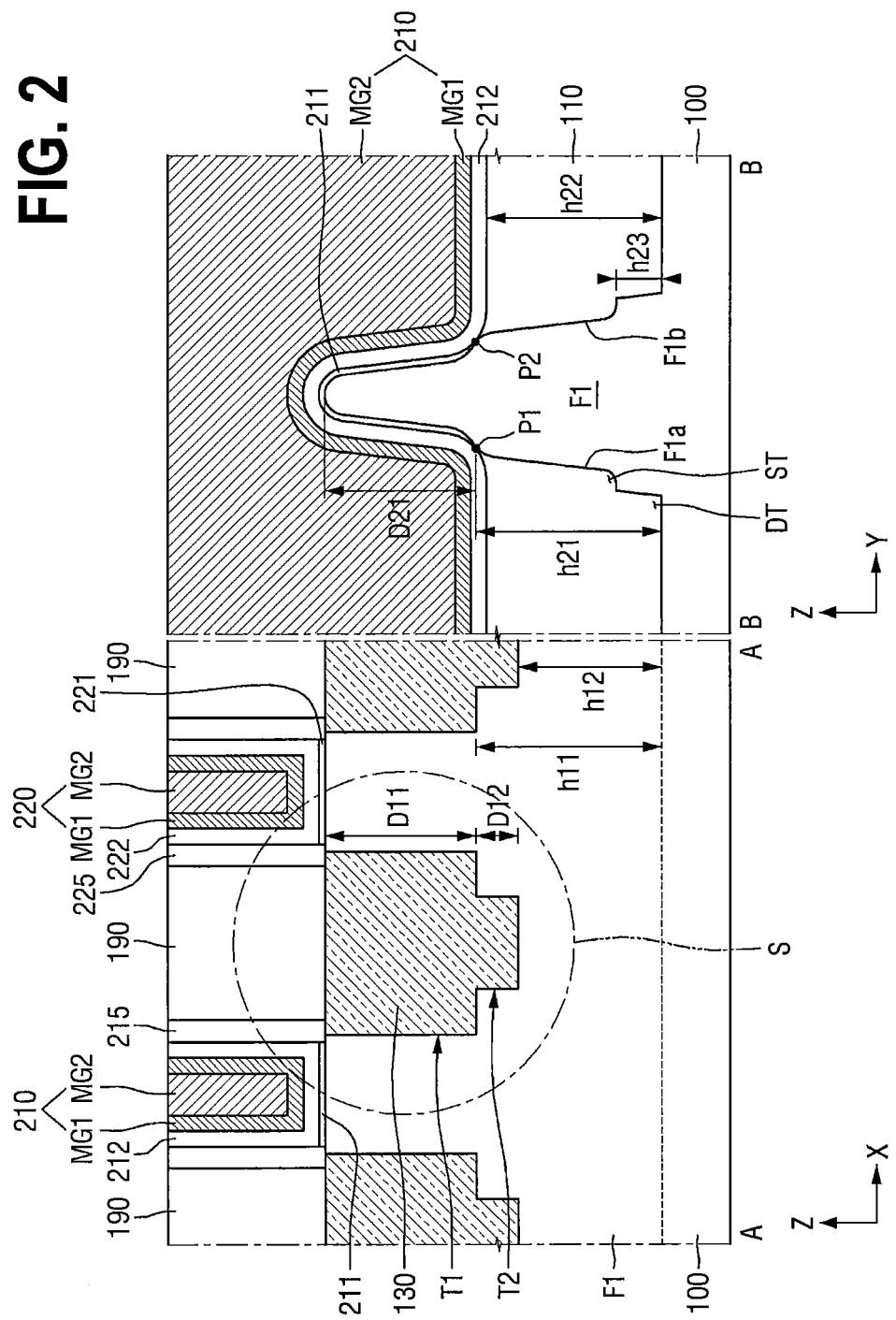
FIG. 2 is a cross-sectional view taken from a line A-A and a line B-B of FIG. 1.
Figure 3:
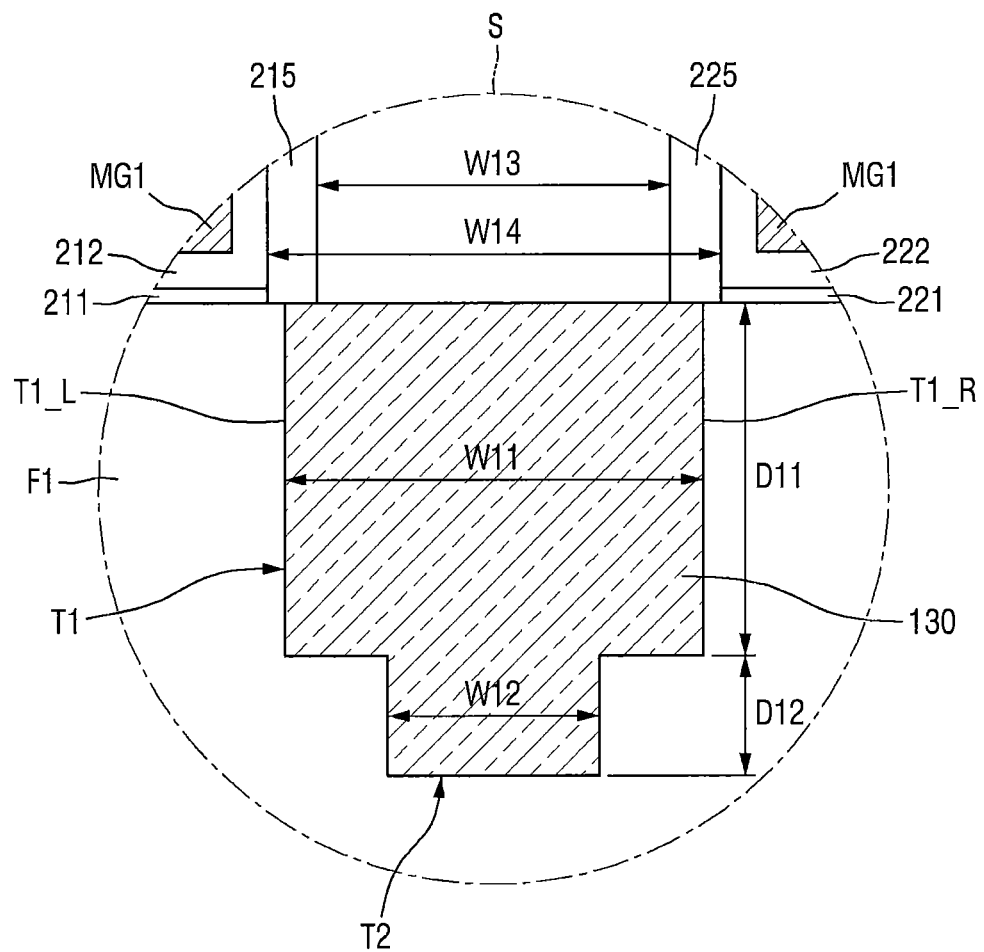
FIG. 3 is an enlarged view illustrating a region S of FIG. 2.
Figure 4:
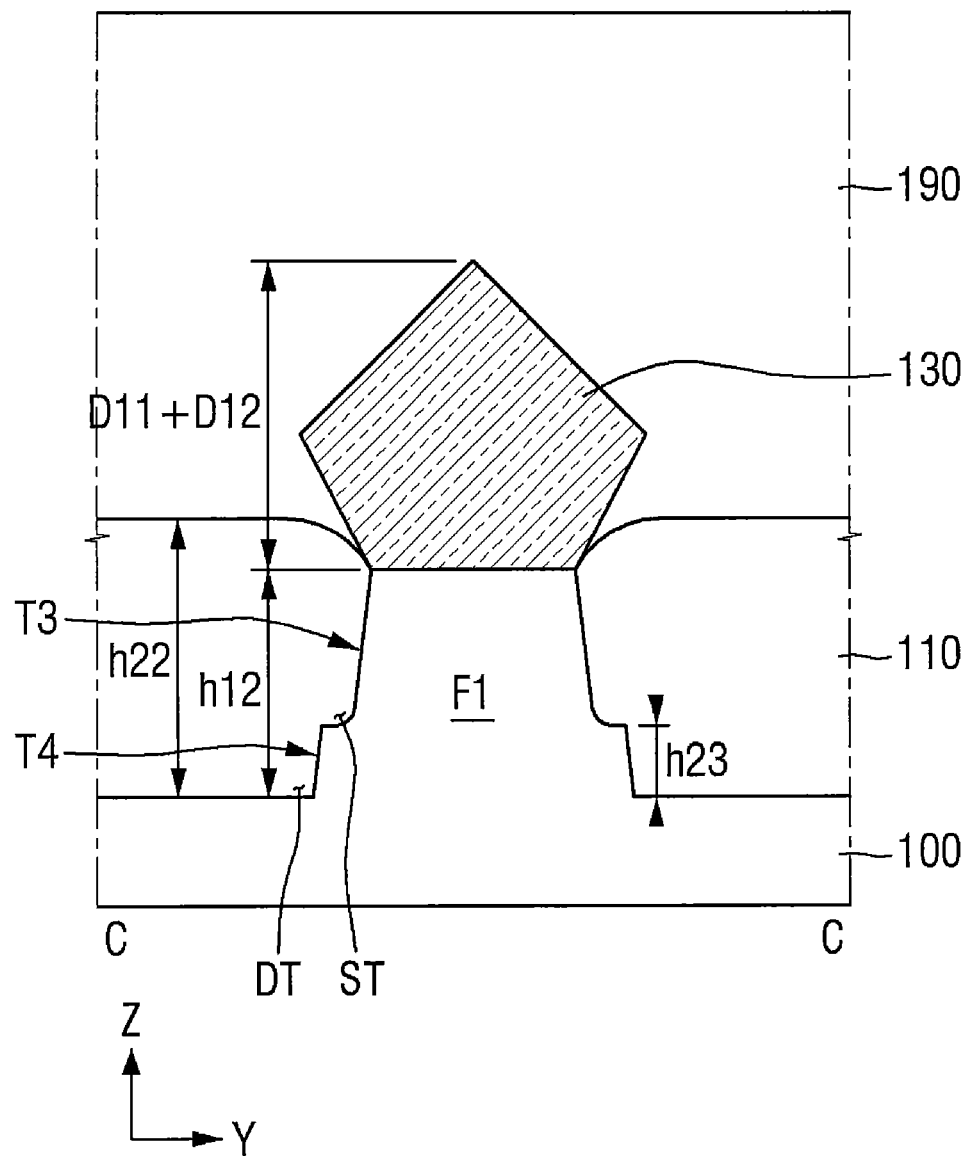
FIG. 4 is a cross-sectional view taken along a line C-C of FIG. 1.

FIG. 1 is a layout diagram illustrating a semiconductor device according to aspects of the present disclosure. FIG. 2 is a cross-sectional view taken from a line A-A and a line B-B of FIG. 1. FIG. 3 is an enlarged view illustrating a region S of FIG. 2. FIG. 4 is a cross-sectional view taken along a line C-C of FIG. 1.

Referring to FIGS. 1 to 4, a semiconductor device according to aspects of the present disclosure may include a substrate 100, a fin-shaped pattern F, a field insulating film 110, a first gate electrode 210, a second gate electrode 220, a first gate spacer 215, a second gate spacer 225, a first trench T1, a second trench T2 and the like.

The substrate 100, for example, may be bulk silicon or silicon-on-insulator (SOI). Alternatively, the substrate 100 may be a silicon substrate and may contain other materials, e.g., silicon germanium (SiGe), indium antimonide (InSb), lead telluride (PbTe), indium arsenide (InAs), indium phosphide (InP), gallium arsenide (GaAs) or gallium antimonide (GaSb). Alternatively, the substrate 100 may have a configuration in which an epitaxial layer is formed on the base substrate.

The fin-shaped pattern F1 may protrude from the substrate 100. The field insulating film 110 may cover a part of the side surface of the fin-shaped pattern F1. Because the field insulating film 110 may cover a part of the side surface of the fin-shaped pattern F1, at least a part of the fin-shaped pattern F1 protrudes upward from the field insulating film 110. That is, a part of the top surface of the first fin-shaped active pattern may protrude upward from the top surface of the field insulating film 110.

The fin-shaped pattern F1 is defined by the field insulating film 110. The fin-shaped pattern F1 may extend long along a first direction X. The field insulating film 110, for example, may include, but is not limited to, one of an oxide film, a nitride film, an oxynitride film or a combination thereof.

The fin-shaped pattern F1 may be a part of the substrate 100, and may include an epitaxial layer that is grown from the substrate 100. The fin-shaped pattern F1, for example, may include silicon or germanium that is an elemental semiconductor material. Further, the fin-shaped pattern F1 may include a compound semiconductor, and for example, may include a group IV-IV compound semiconductor or a group III-V compound semiconductor.

Specifically, taking the group IV-IV compound semiconductor as an example, the fin-shaped pattern F1 may be a binary compound, a ternary compound which contains at least two of carbon (C), silicon (Si), germanium (Ge) and tin (Sn), or a compound in which these elements are doped with the group IV element.

Taking the group III-V compound semiconductor as an example, the fin-shaped pattern F1 may be one of the binary compound, the ternary compound or the quaternary compound that is formed by binding of at least one of aluminum (Al), gallium (Ga) and indium (In) as the group III element with one of phosphorus (P), arsenic (As) and antimonium (Sb) as the group V element.

In the semiconductor devices described herein, the fin-shaped pattern F1 may be described as a silicon fin-shaped active pattern that contains silicon.

The first gate electrode 210 may be formed to intersect with the fin-shaped pattern F1 by extending in a second direction Y. The first gate electrode 210 may be formed on the fin-shaped pattern F1 and on the field insulating film 110.

The second gate electrode 220 may be formed to intersect with the fin-shaped pattern F1 by extending in the second direction Y. The second gate electrode 220 may be formed in parallel with the first gate electrode 210. The second gate electrode 220 may be formed on the fin-shaped pattern F1 and on the field insulating film 110.

The first gate electrode 210 and the second gate electrode 220 may be arranged in the first direction X.

The first gate electrode 210 may include metal layers MG 1, MG 2. As illustrated, two or more metal layers MG 1, MG2 may be laminated on the first gate electrode 210. The first metal layer MG1 may serve to adjust the work function, and the second metal layer MG2 may serve to fill a space formed by the first metal layer MG1. For example, the first metal layer MG1 may include at least one of titanium nitride (TIN), tantalum nitride (TaN), titanium carbide (TiC) and tantalum carbide (TaC). Further, the second metal layer MG2 may include tungsten (W) or aluminum (Al). Alternatively, the first gate electrode 210 may be made of silicon (Si), silicon germanium (SiGe) or the like other than the metal. The first gate electrode 210, for example, may be formed through a replacement process, but methods of forming the first gate electrode are not limited thereto.

The second gate electrode 220 may include a first metal layer MG1 and a second metal layer MG2 as in the first gate electrode 210. Description of the second gate electrode 220 may be substantially identical to the description of the first gate electrode 210.

The first gate electrode 210 and the second gate electrode 220, for example, may be formed through a replacement process (or a gate last process), but methods of forming the first gate electrode are not limited thereto.

Although the terms such as first and second are used herein to describe various elements, components and/or sections in the present detailed description, the elements, components and/or sections are, of course, not limited by these terms. These terms are used to only distinguish one element, component or section from another element, component or section. Thus, it is a matter of course that a first element, a first component or a first section mentioned herein may also be a second element, a second component or a second section within the technical scope of the present disclosure.

Gate insulating films 211, 212 may be formed between the fin-shaped pattern F1 and the first gate electrode 210. The gate insulating films 211, 212 may include an interfacial film 211 and a high dielectric constant insulating film 212.

The interfacial film 211 may be formed by partially oxidizing the fin-shaped pattern F1. The interfacial film 211 may be formed along the profile of the fin-shaped pattern F1 which protrudes upward from the top surface of the field insulating film 110. When the fin-shaped pattern F1 is a silicon fin-shaped pattern that includes silicon, the interfacial film 211 may include a silicon oxide film.

In FIG. 4, the interfacial film 211 is illustrated as not being formed along the top surface of the field insulating film 110, but the present disclosure not limited thereto. Depending on the method of forming the interfacial film 211, the interfacial film 211 may also be formed along the top surface of the field insulating film 110.

In some aspects, even if the field insulating film 110 contains the silicon oxide, the physical properties of the silicon oxide contained in the field insulating film 110 may differ from the physical properties of the silicon oxide film contained in the interfacial film 211. In some aspects, the interfacial film 211 may be formed along the top surface of the field insulating film 110.

The high dielectric constant insulating film 212 may be formed between the interfacial film 211 and the first gate electrode 210. The high dielectric constant insulating film 212 may be formed along the profile of the fin-shaped pattern F1 which protrudes upward from the top surface of the field insulating film 110. Also, the high dielectric constant insulating film 212 may be formed between the first gate electrode 210 and the field insulating film 110.

The high dielectric constant insulating film 212, for example, may include, but is not limited to, one or more of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The second gate electrode 220 may also include gate insulating films 221, 222. The description of the second gate electrode 220 and the gate insulating films 221, 222 may be substantially identical to the description of the gate insulating films 211, 212 of the first gate electrode 210.

A first gate spacer 215 may be formed on the side wall of the first gate electrode 210 extending in the second direction Y. A second gate spacer 225 may be formed on the side wall of the second gate electrode 220 extending in the second direction Y.

Each of the first gate spacer 215 and the second gate spacer 225, for example, may include at least one of silicon nitride (SiN), silicon oxynitride (SiON), silicon oxide (SiO2), silicon oxycarbonitride (SiOCN) and a combination thereof. Each of the first gate spacer 215 and the second gate spacer 225 is illustrated as a single film, but is not limited thereto, and each of them, of course, may have a structure of multi films.

Herein, a case where one element or layer is referred to as "above" or "on" another element or layer includes a case where one element or layer is located just above another element or layer, and a case where another layer or another element is interposed in the middle. Meanwhile, a case where the element is referred to as "directly above" or "just above" indicates a case where another element or layer is not interposed in the middle.

The first trench T1 may be formed between the first gate electrode 210 and the second gate electrode 220. More specifically, the first trench T1 may be formed between the first gate spacer 215 and the second gate spacer 225 facing each other across an interlayer insulating film 190 (discussed further below).

The first trench T1 may be formed to have a first width (W11 of FIG. 3). Specifically, the first width W11 of the first trench T1 may be formed to be smaller than a width (W14 of FIG. 3) between the side wall of first gate electrode 210 and the side wall of the second gate electrode 220 facing each other, and to be greater than a width W13 between the outer wall of the first gate spacer 215 and the outer wall of the second gate spacer 225 facing each other.

The first trench T1 may not overlap the first gate electrode 210 or the second gate electrode 220. Further, one side wall of the first trench T1 may be formed below the first gate spacer 215 or the second gate spacer 225 so as to overlap with the first gate spacer 215 or the second gate spacer 225. In some aspects, the one side wall T1_L of the first trench T1 and the side wall of the first gate spacer 215, and the other side wall T1_R of the first trench T1 and the side wall of the second gate spacer 225 may not be aligned in a row.

The width between the side walls of the first trench T1 facing each other may be formed to have a constant first width W11 from the top to the bottom of the fin-shaped pattern F1. That is, the side walls of the first trench T1 may be formed to extend perpendicularly in a downward direction from the upper portion of the fin-shaped pattern F1. For example, the side walls of the first trench T1 may be perpendicular to the top surface of the substrate 100. However, the present disclosure is not limited thereto, and as will be described in detail below, the first trench T1 may have a U-shaped profile with rounded corners or may have a profile with oblique corners. In some aspects, the width of the side walls of the first trench T1 facing each other may be reduced toward the bottommost surface.

The second trench T2 may be formed between the first gate electrode 210 and the second gate electrode 220. More specifically, the second trench T2 may be formed below the first trench T1. The second trench T2 is also formed in the fin-shaped pattern F1. In some aspects, the second trench T2 is formed to be deeper than the first trench T1, and the first trench T1 and the second trench T2, or the side walls thereof, may form a stepped profile.

The second trench T2 may be formed to have a second width (W12 of FIG. 3) that is smaller than the first width W11 of the first trench T1. Specifically, the second width W12 of the second trench T2 may be formed to be smaller than the width W13 between the outer wall of the first gate spacer 215 and the outer wall of the second gate spacer 225 facing each other.

Further, the second trench T2 may be formed to be deeper than the first trench T1. For example, a depth D11+D12 of the second trench T2 measured from the top surface of the fin-shaped pattern F1 may be greater than a depth D11 of the bottom surface of the first trench T1.

The second trench T2 may not overlap the first gate electrode 210 or the second gate electrode 220. Further, the second trench T2 may not overlap the first gate spacer 215 or the second gate spacer 225.

The width between side walls of the second trench T2 facing each other may be formed as a constant second width W12 from the top to the bottom of the fin-shaped pattern F1. That is, side walls of the second trench T2 may be formed to extend perpendicularly in the downward direction from the upper portion of the fin-shaped pattern F1. For example, side walls of the second trench T2 may be perpendicular to the top surface of the substrate 100. However, the present disclosure is not limited thereto, and as it will be described in detail below, the second trench T2 may have a U-shaped profile with rounded corners or may have a profile with oblique corners. In some aspects, the width of the side walls of the second trench T2 facing each other may be reduced toward the bottommost surface.

Accordingly, the first trench T1 and the second trench T2 may form a secondary recess structure in the fin-shaped pattern F1. The profile of the secondary recess structure may minimize the overlap between the gate electrode and the epitaxial layer, thereby making it possible to secure a sufficient distance from a channel of a transistor, and to improve the characteristics of the semiconductor element.

A height h11 from the top surface of the substrate 100 to a bottom surface of the first trench T1 may be greater than a height h21 to the top surface of the field insulating film 110. That is, the first trench T1 may be formed above the field insulating film 110.

The height h12 from the top surface of the substrate 100 to the bottom surface of the second trench T2 may be smaller than a height h21 to the top surface of the field insulating film 110. That is, the second trench T2 may be formed in the first trench T1 to be deeper than the top surface of the field insulating film 110. However, as will be described later, the present disclosure is not limited thereto.

An epitaxial layer 130 may be formed on the fin-shaped pattern F1 between the first gate electrode 210 and the second gate electrode 220. In some aspects, the epitaxial layer 130 may be integrally formed along the profiles of the first trench T1 and the second trench T2. In semiconductor devices according to aspects of the present disclosure, an epitaxial layer 130 may be a shared source/drain that is common to the first gate electrode 210 and the second gate electrode 220 formed on the channel region.

An outer peripheral surface of the epitaxial layer 130 may have various shapes. For example, the outer peripheral surface of the epitaxial layer 130 may be at least one of a diamond shape, a circular shape and a rectangular shape. FIG. 4 illustrates a diamond shape as an example.

The epitaxial layer 130 may fill the first trench T1 and the second trench T2. The epitaxial layer 130 may be in contact with at least a part of the bottom surface of the first gate spacer 215 and at least a part of the bottom surface of the second gate spacer 225.

When a semiconductor device according to aspects of the present disclosure is a PMOS transistor, the epitaxial layer 130 may include a compressive stress material. For example, the compressive stress material may be a material having a lattice constant greater than Si, and for example, may be SiGe. For example, the compressive stress material may improve mobility of the carrier in the channel region by applying the compressive stress to the fin-shaped pattern F1.

Alternatively, when a semiconductor device according to aspects of the present disclosure is an NMOS transistor, the epitaxial layer 130 may include a tensile stress material. For example, when the fin-shaped pattern F1 is silicon, the epitaxial layer 130 may be a material (e.g., SiC) having a lattice constant smaller than silicon. For example, the tensile stress material may improve the mobility of the carrier in the channel region by applying the tensile stress to the fin-shaped pattern F1.

The interlayer insulating film 190 may cover the fin-shaped pattern F1, the epitaxial layer 130 or the like. Although it is not clearly illustrated in the drawings, the interlayer insulating film 190 may cover the first gate electrode 210, the second gate electrode 220, the first gate spacer 215 and the second gate spacer 225. The interlayer insulating film 190 may be formed on the field insulating film 110.

The interlayer insulating film 190, for example, may contain at least one of silicon oxide, silicon nitride, and a low dielectric constant material having a dielectric constant lower than silicon oxide silicon and oxynitride. The low dielectric constant material, for example, may contain, but is not limited to, Flowable Oxide (FOX), Torene Silazene (TOSZ), Undoped Silica Glass (USG), Borosilica Glass (BSG), Phosphosilica Glass (PSG), Borophosphosilica Glass (BPSG), Plasma Enhanced Tetra Ethyl Ortho Silicate (PETEOS), Fluoride Silicate Glass (FSG), Carbon Doped Silicon Oxide (CDO), Xerogel, Aerogel, Amorphous Fluorinated Carbon, Organo Silicate Glass (OSG), Parylene, bis-benzocyclobutenes (BCB), SiLK, polyimide, porous polymeric material or a combination thereof.

Meanwhile, referring to the cross-section taken along the line B-B of FIG. 2, the fin-shaped pattern F1 may include a first side wall F1a and a second side wall F1b facing each other. The first side wall F1a may include a first inflection point P1, and the second side wall F1b may include a second inflection point P2. The first inflection point P1 and the second inflection point P2 may be formed on the same plane. In the fin-shaped pattern F1, a portion higher than the first inflection point P1 and the second inflection point P2 may be defined as a fin height. The fin height D21 of the fin-shaped pattern F1 may be the same as the depth D11 from the top surface of the fin-shaped pattern F1 to the bottom surface of the first trench T1. However, the present disclosure is not limited thereto.

The fin-shaped pattern F1 of the portion lower than the first inflection point P1 and the second inflection point P2 is in contact with the field insulating film 110, and the first fin-shaped pattern 110 of the portion higher than the first inflection point P1 and the second inflection point P2 may be in contact with the surface film 211. However, the present disclosure is not limited thereto.

The field insulating film 110 may be in contact with a part of the fin-shaped pattern F1. A part of the first side wall F1a of the fin-shaped pattern F1, and a part of the second side wall F1b of the fin-shaped pattern F1 may be in contact with the field insulating film 110.

In some aspects, the height h21 from the top surface of the substrate 100 to the first inflection point P1 or the second inflection point P2 may be the same as the height h11 from the top surface of the substrate 100 to the bottom surface of the first trench T1. That is, the first inflection point P1 or the second inflection point P2 and the bottom surface of the first trench T1 may be disposed on the same plane. In this case, the second trench T2 may be located below the first inflection point P1 or the second inflection point P2. That is, the height h21 from the top surface of the substrate 100 to the first inflection point P1 or the second inflection point P2 may be greater than the height h12 from the top surface of the substrate 100 to the bottom surface of the second trench T2. However, the present disclosure is not limited thereto.

Further, in some aspects the height h21 from the top surface of the substrate 100 to the first inflection point P1 or the second inflection point P2 may be greater than the height h22 from the top surface of the substrate 100 to the top surface of the field insulating film 110. In this case, the height h22 from the top surface of the substrate 100 to the top surface of the field insulating film 110 is smaller than the height h11 to the bottom surface of the first trench T1, and may be greater than the height h12 to the bottom surface of the second trench T2. However, the present disclosure is not limited thereto. The first inflection point P1 or the second inflection point P2 and the top surface of the field insulating film 110 may be disposed on the same plane, or the top surface of the field insulating film 110 may be disposed above the first inflection point P1 or the second inflection point P2.

Referring to FIG. 4, the outer peripheral surface of the epitaxial layer 130 of the semiconductor device may include a diamond shape. The epitaxial layer 130 may be formed at the same height as the depth D11+D12 from the top surface of the fin-shaped pattern F1 to the bottom surface of the second trench T2.

At this time, based on the substrate 100, the height h12 to the bottom surface of the epitaxial layer 130 may be lower than the height to the top surface h22 of the field insulating film 110. Further, the top surface of the field insulating film 110 may be higher than a point in which that top surface of the field insulation film 110 is in contact with the fin-shaped pattern F1. That is, the top surface of the field insulating film 110 may come closer to the top surface of the substrate 100 as it comes closer to the fin-shaped pattern F1. However, the present disclosure is not limited thereto.

Meanwhile, the fin-shaped pattern F1 may be defined by a shallow trench ST of a first depth h22−h23, and the active region may be defined by a deep trench DT of the second depth h22 that is deeper than the shallow trench ST.

In a semiconductor device according to aspects of the present disclosure, the shallow trench ST and the deep trench DT may be disposed on both sides of the fin-shaped pattern F1.

The shallow trench ST and the deep trench DT may be disposed immediately adjacent to each other. Here, the expression "immediately adjacent" may mean that another shallow trench is not disposed between the deep trench DT and the shallow trench ST.

The field insulating film 110 may be formed to fill a part of the shallow trench ST and a part of the deep trench DT.

As illustrated in FIG. 2, the number of fin-shaped pattern formed in the active region may be one, and each of the first side wall F1a of the fin-shaped pattern F1 and the second side wall F1b of the fin-shaped pattern F1 may be connected to the deep trench DT through the bottom of the shallow trench ST.

Although it is not clearly illustrated in the drawings, the semiconductor device may include a protruding structure that is formed to protrude from the bottom of the shallow trench ST. The protruding structure may be located on the boundary between the first shallow trench ST1 and the deep trench DT.

Figure 5:
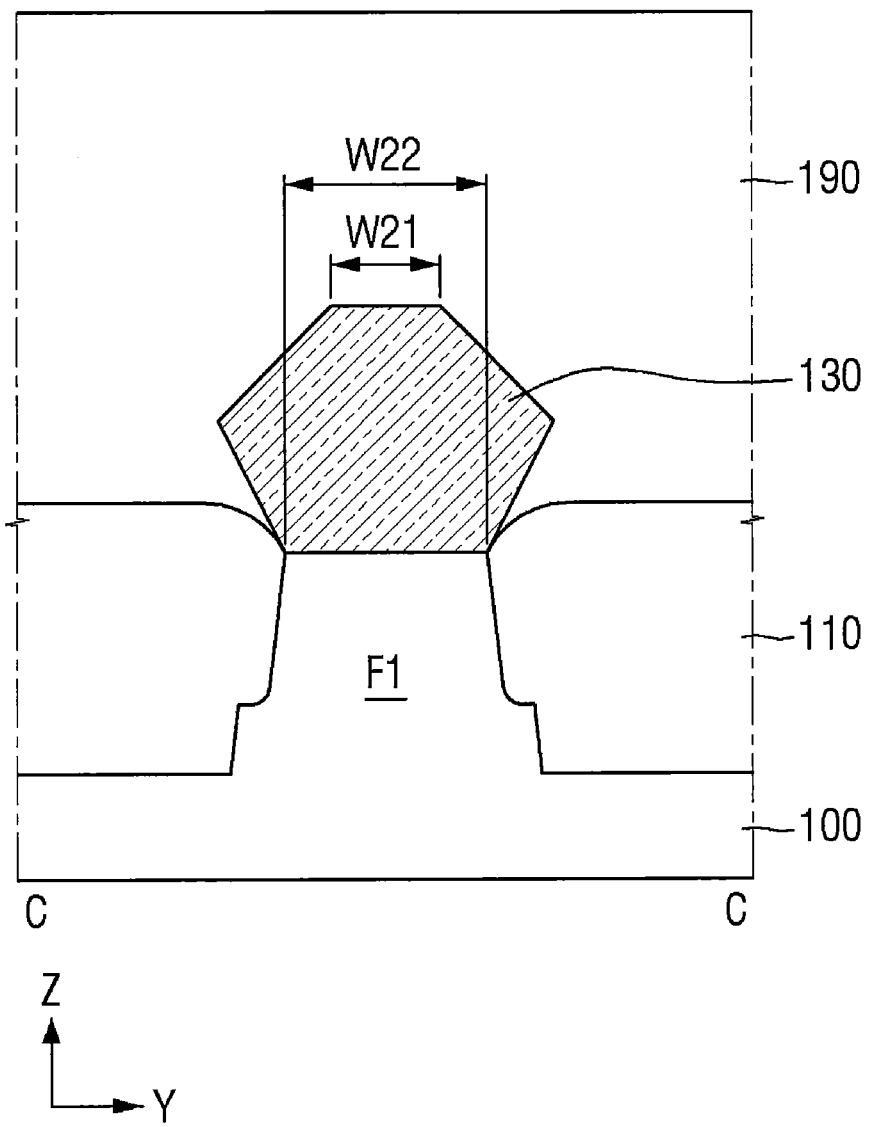
FIG. 5 is a cross-sectional view for explaining a semiconductor device according to aspects of the present disclosure.

FIG. 5 is a cross-sectional view for explaining a semiconductor device according to some aspects of the present disclosure. Hereinafter, for convenience of explanation, differences from those described with reference to FIGS. 1 to 4 will be mainly described.

Referring to FIG. 5, according to some aspects of the present disclosure, the outer peripheral surface of the epitaxial layer 130 of the semiconductor device may include a hexagonal shape. In some aspects, a length W21 of the top surface of the epitaxial layer 130 may be smaller than a length W22 of the bottom surface of the epitaxial layer 130. However, the present disclosure is not limited thereto, and as such a shape of the epitaxial layer 130 may be obtained by schematization of a theoretical shape. In the case of the formed product, each corner portion of the epitaxial layer 130 may be formed to be rounded.

Figure 6:
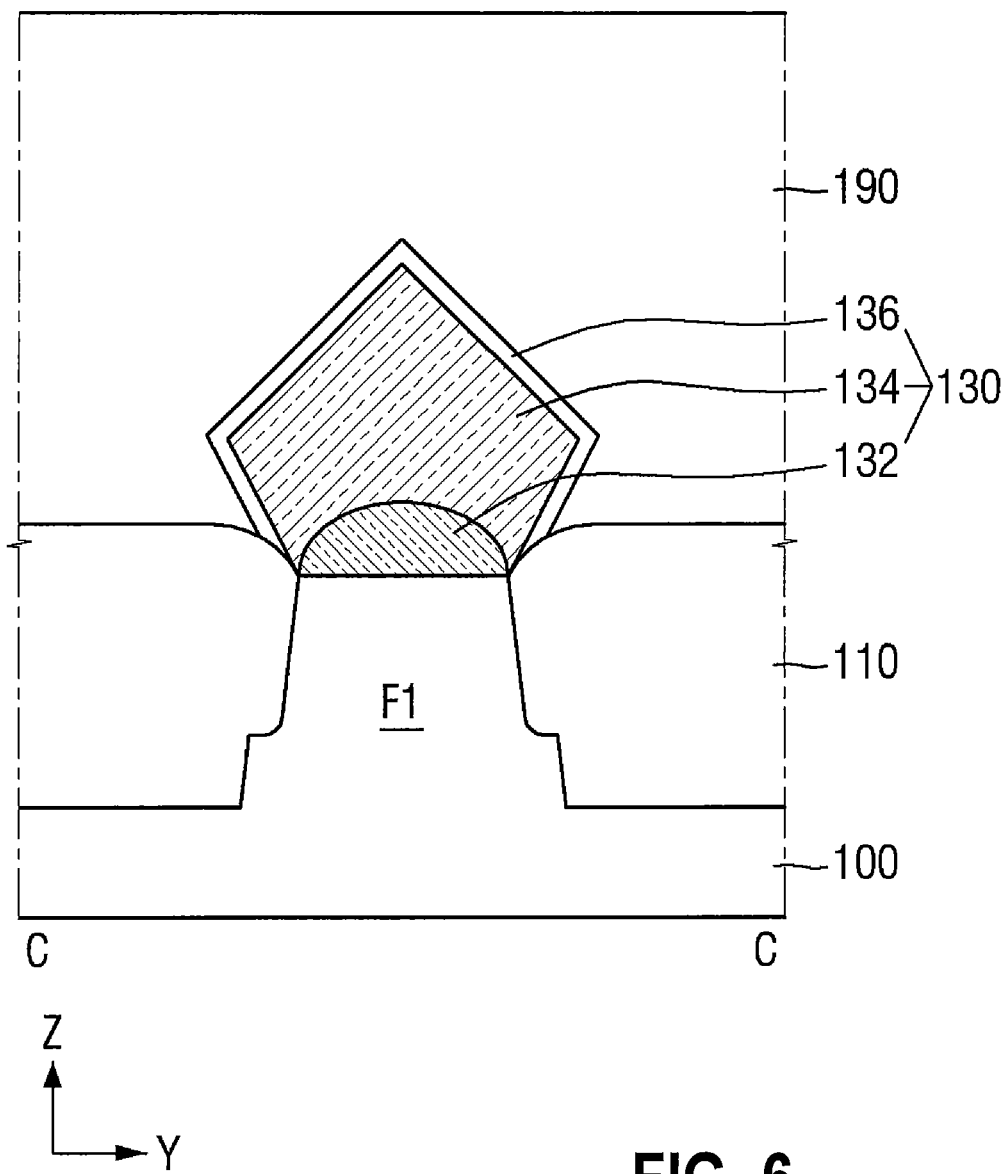
FIG. 6 is a cross-sectional view for explaining a semiconductor device according to aspects of the present disclosure.

FIG. 6 is a cross-sectional view for explaining a semiconductor device according to some aspects of the present disclosure. Hereinafter, for convenience of explanation, differences from those described with reference to FIGS. 1 to 4 will be mainly described.

Referring to FIG. 6, according to some aspects of the present disclosure, an epitaxial layer 130 of the semiconductor device may include a first epitaxial layer 132, a second epitaxial layer 134 and a third epitaxial layer 136.

The first epitaxial layer 132 may be formed on the top surface of the fin-shaped pattern F1, and its outer peripheral surface may be formed in a rounded semi-circular shape. The first epitaxial layer 132 may be formed at an intermediate step of growing the epitaxial layer 130.

The second epitaxial layer 134 may be formed to cover the top surface of the first epitaxial layer 132, and the outer peripheral surface of the second epitaxial layer 134 may be at least one of a diamond shape, a circular shape and a rectangular shape. FIG. 6 illustrates a diamond shape as an example, but the present disclosure is not limited thereto.

The third epitaxial layer 136 may be formed to cover the top surface of the second epitaxial layer 134, and may be conformally formed on the outer peripheral surface of the second epitaxial layer 134 with a constant thickness.

The first to third epitaxial layers 132, 134, 136 may be formed in different processes. As a method of growing the epitaxial layer 130 on the fin-shaped pattern F1, any one of a solid phase epitaxy technique (SPE), a liquid phase epitaxy technique (LPE) and a vapor phase epitaxy technique (VPE) may be used. However, the present disclosure is not limited thereto.

Figure 7:
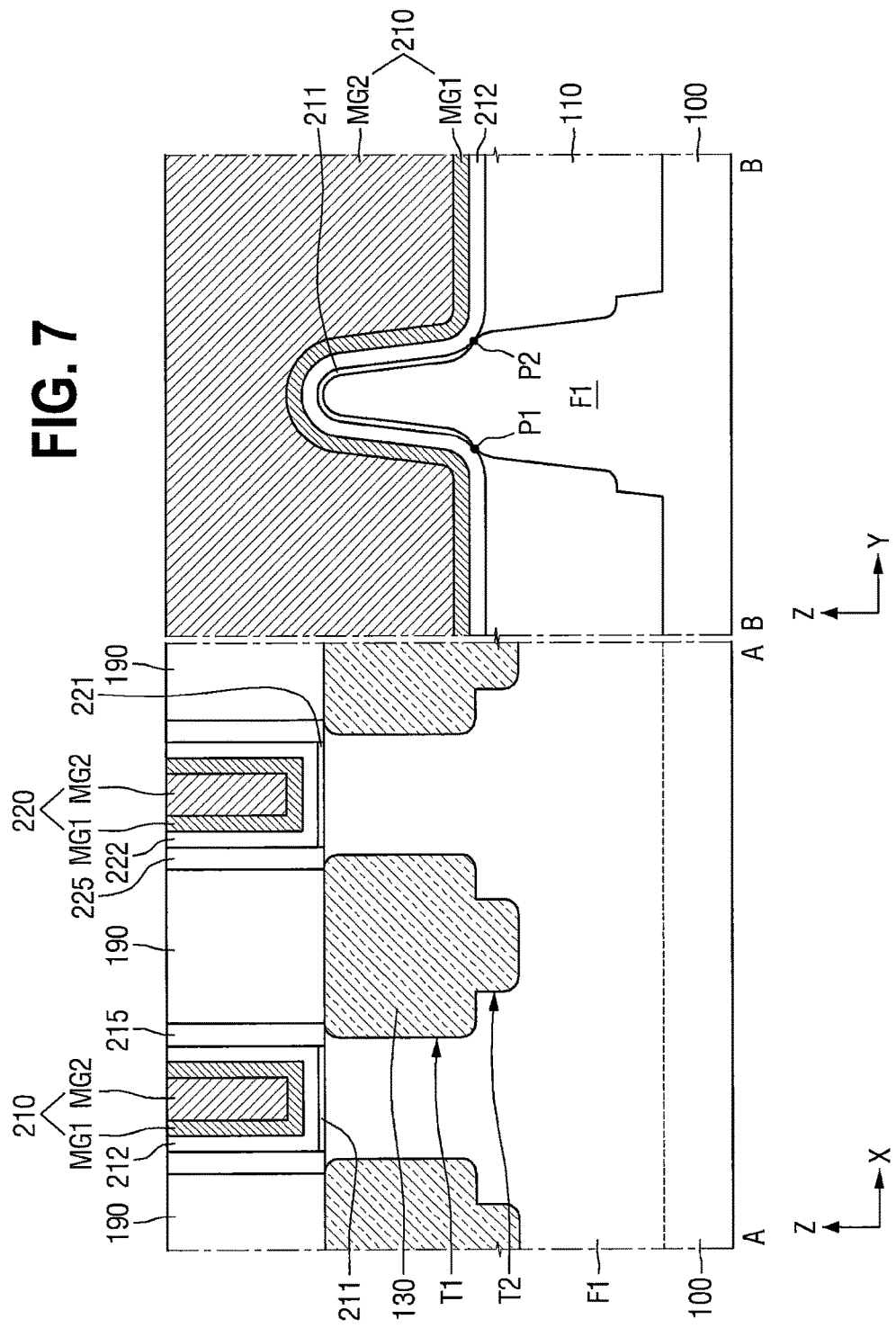
FIG. 7 is a cross-sectional view for explaining a semiconductor device according to aspects of the present disclosure.

FIG. 7 is a cross-sectional view for explaining a semiconductor device according to some aspects of the present disclosure. Hereinafter, for convenience of explanation, differences from those described with reference to FIGS. 1 to 4 will be mainly described.

Referring to FIG. 7, according to some aspects of the present disclosure, a semiconductor device may be substantially similar to the semiconductor device described with reference to FIGS. 1 to 4 above. However, the first trench T1 may have a shape in which the width decreases toward the topmost surface of fin-shaped pattern F1. In some aspects, each corner portion of the first trench T1 may have a rounded shape, an oblique shape or a chinned structure shape.

Similarly, each corner of the second trench T2 may have a rounded shape or an oblique shape.

In some aspects, the epitaxial layer 130 may not be in contact with the bottom surface of the first gate spacer 215 or the second gate spacer 225.

Such profiles of the first trench T1 and the second trench T2 may minimize the overlap between the gate electrode and the epitaxial layer in the semiconductor device of the example embodiments, may further reduce the short channel margin between the gate electrode and the epitaxial layer by ensuring a constant distance from the transistor channel, and may improve characteristics of the semiconductor element, accordingly.

Figure 8:
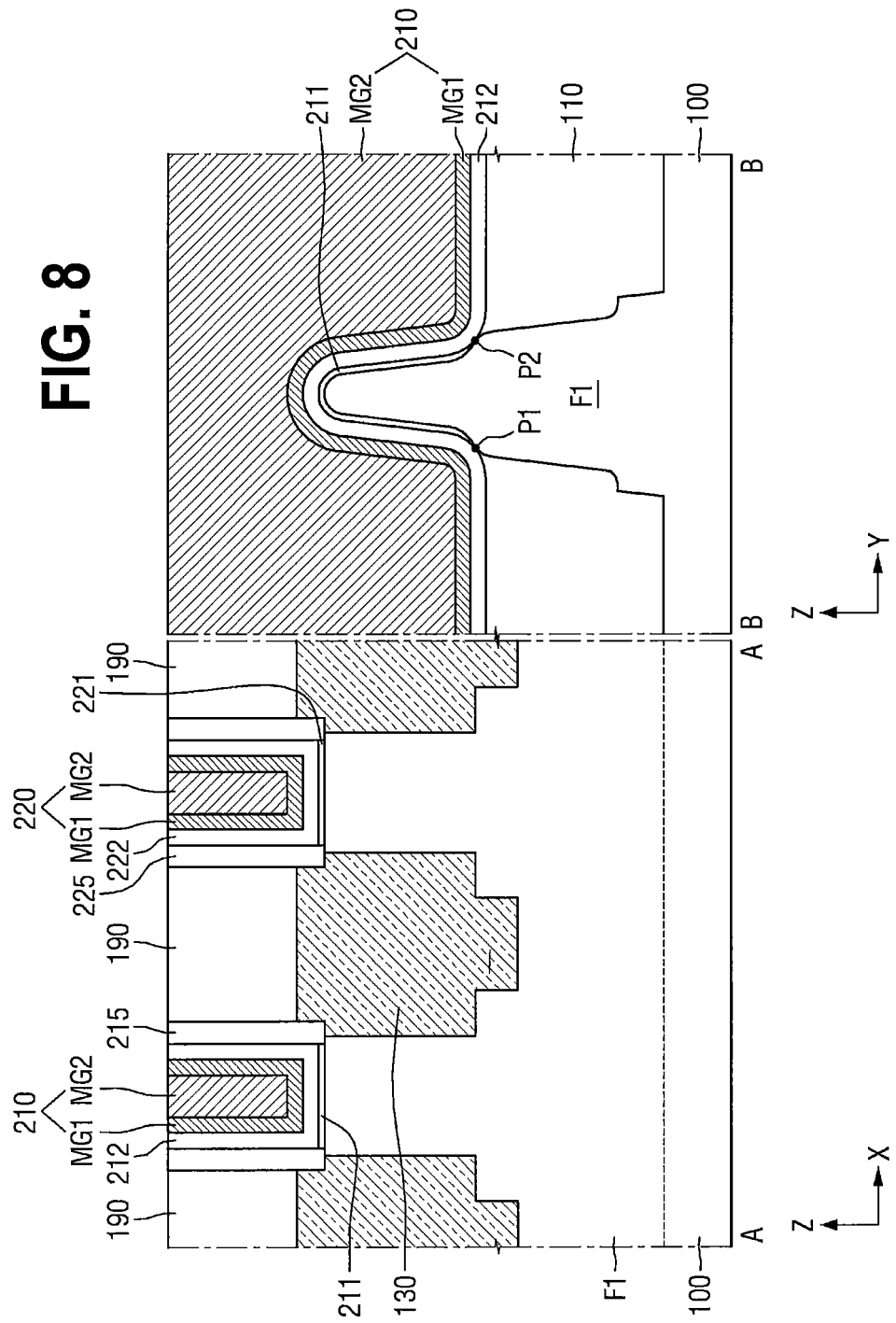
FIG. 8 is a cross-sectional view for explaining a semiconductor device according to aspects of the present disclosure.

FIG. 8 is a cross-sectional view for explaining a semiconductor device according to some aspects of the present disclosure. Hereinafter, for convenience of explanation, differences from those described with reference to FIGS. 1 to 4 will be mainly described.

Referring to FIG. 8, according to some aspects of the present disclosure, in the semiconductor device, an epitaxial layer 130 may be an elevated source/drain. That is, the topmost surface of the epitaxial layer 130 may protrude upward from the top surface of the fin-shaped pattern F1. Further, the topmost surface of the epitaxial layer 130 may be formed above the bottom surfaces the first gate electrode 210 and the second gate electrode 220. The epitaxial layer 130 may be in contact with the bottom of the side wall of the first gate spacer 215 or the second gate spacer 225. However, the present disclosure is not limited thereto.

Figure 9:
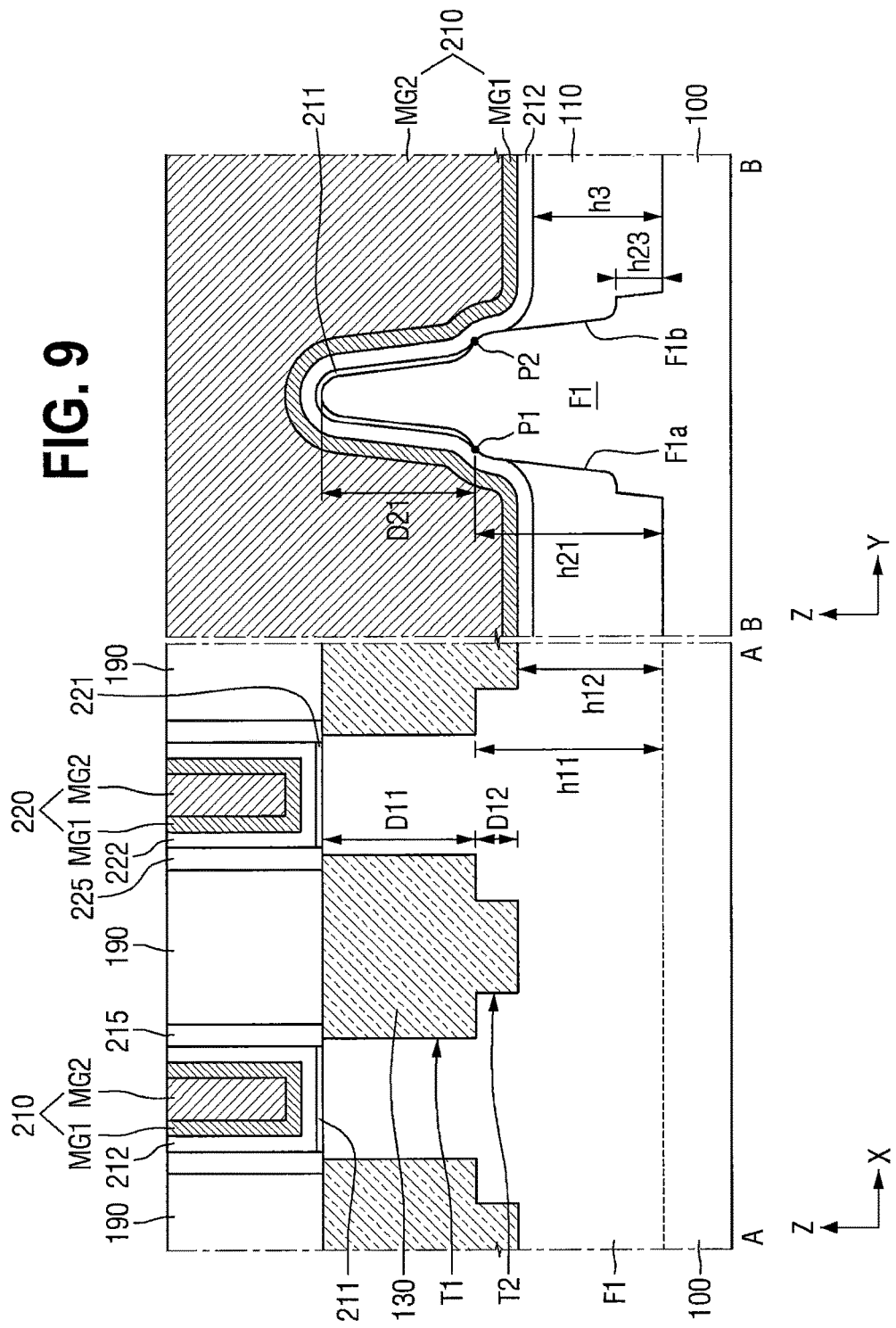
FIGS. 9 and 10 are cross-sectional views for explaining a semiconductor device according to aspects of the present disclosure.
Figure 10:
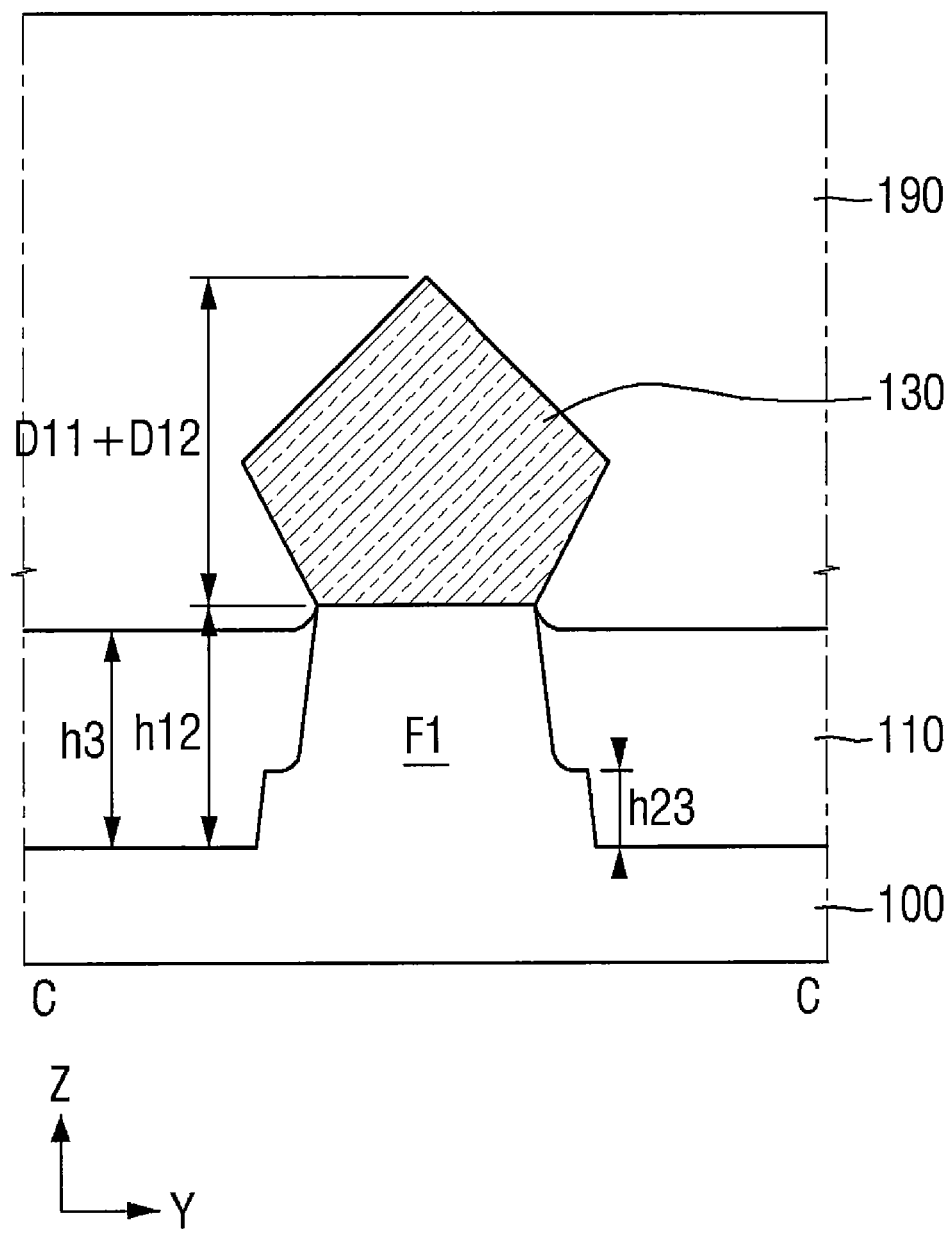

FIGS. 9 and 10 are cross-sectional views for explaining a semiconductor device according to some aspects of the present disclosure. Hereinafter, for convenience of explanation, differences from those described with reference to FIGS. 1 to 4 will be mainly described.

Referring to FIG. 9, according to some aspects of the present disclosure, a field insulating film 110 of a semiconductor device may be in contact with a part of the fin-shaped pattern F1. A part of the first side wall F1a of the fin-shaped pattern F1 and a part of the second side wall F1b of the fin-shaped pattern F1 may be in contact with the field insulating film 110.

In some aspects, a height h3 from the top surface of the substrate 100 to the top surface of the field insulating film 110 may be smaller than a height h12 from the top surface of the substrate 100 to the bottom surface of the second trench T2. That is, the top surface of the field insulating film 110 may be located below the bottom surface of the second trench T2.

Accordingly, the height h11 from the top surface of the substrate 100 to the top surface of the first trench T1b is greater than the height h3 from the top surface of the substrate 100 to the top surface of the field insulating film 110. Even in this case, the first inflection point P1 or the second inflection point P2 and the top surface of the field insulating film 110 may be disposed on the same plane. However, the present disclosure is not limited thereto.

Referring to FIG. 10, according to some aspects of the present disclosure, the outer peripheral surface of the epitaxial layer 130 of the semiconductor device may include a diamond shape, and the epitaxial layer 130 may be formed at the same height as the depth D11+D12 from the top surface of the fin-shaped pattern F1 to the bottom surface of the second trench T2.

In some aspects, based on the substrate 100, the height h12 to the bottom surface of the epitaxial layer 130 may be greater than the height h3 to the top surface of the field insulating film 110. That is, the top surface of the field insulating film 110 may be lower than a point in which the top surface of field insulation film 110 and the fin-shaped pattern F1 are in contact with each other. In some aspects, the top surface of the field insulating film 110 may be away from the top surface of the substrate 100 as it comes closer to the fin-shaped pattern F1. However, the present disclosure is not limited thereto.

Figure 11:
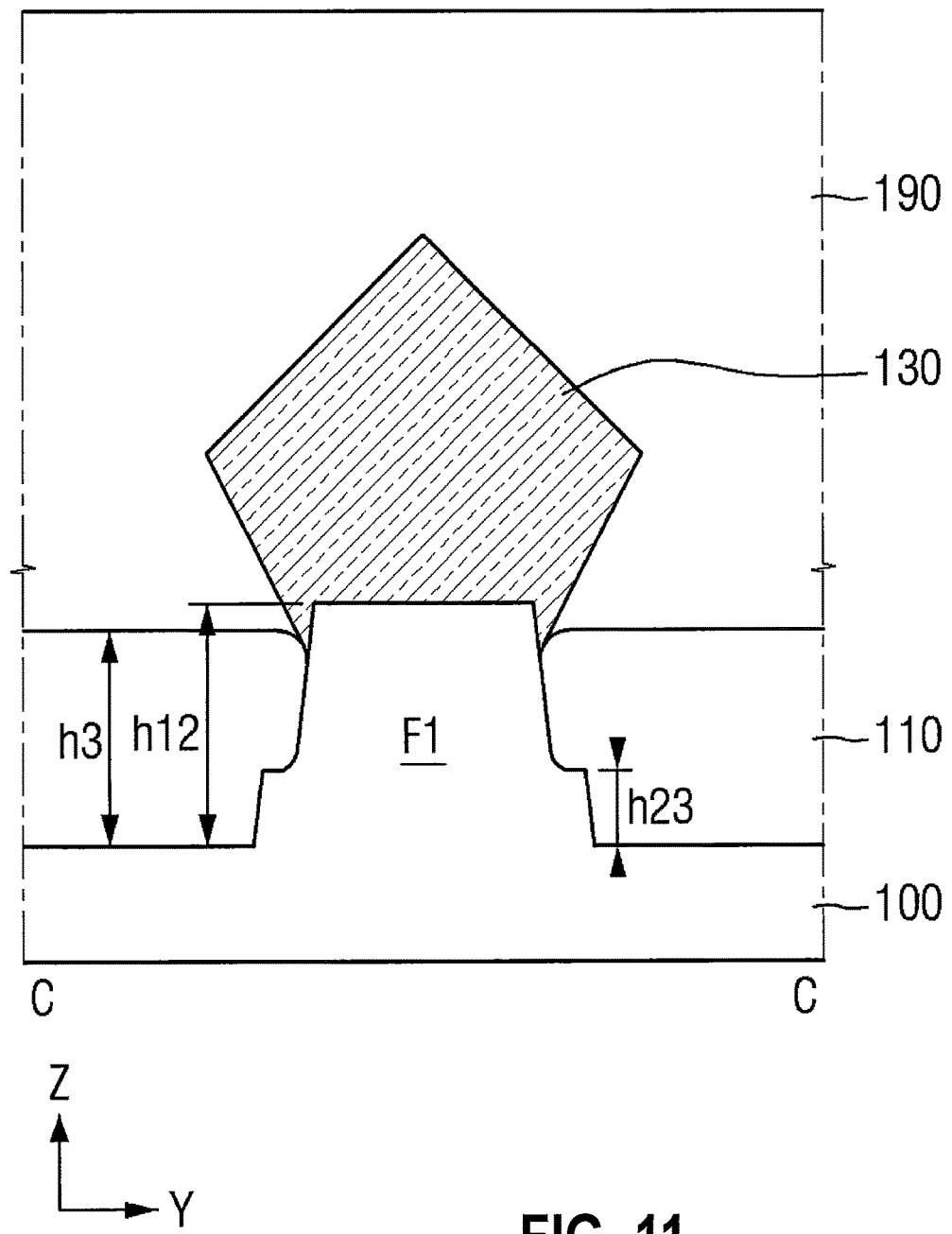
FIG. 11 is a cross-sectional view for explaining a semiconductor device according to aspects of the present disclosure.

FIG. 11 is a cross-sectional view for explaining a semiconductor device according to some aspects of the present disclosure. Hereinafter, for convenience of explanation, differences from those described with reference to FIGS. 9 and 10 will be mainly described.

Referring to FIG. 11, according to some aspects of the present disclosure, an epitaxial layer 130 of the semiconductor device may cover a part of the side surfaces of fin-shaped pattern F1. Specifically, the epitaxial layer 130 may be formed from the side upper portions of the fin-shaped pattern F1 and the top surface of the fin-shaped pattern F1 through an epitaxial growth process. Therefore, the epitaxial layer 130 may be in contact with the side upper portion of the fin-shaped pattern F1 and the top surface of the fin-shaped pattern F1. Accordingly, the semiconductor device according to aspects of the present disclosure may secure a source/drain region of a wide area, and may also improve operation characteristics of the semiconductor device.

The outer peripheral surface of the epitaxial layer 130 may include a diamond shape. However, the present disclosure is not limited thereto, and may include a polygonal shape, an oval shape or the like. The height of the epitaxial layer 130 measured in a third direction (Z-axis) may be formed to be greater than the depth (D11+D12 of FIG. 9) from the top surface of the fin-shaped pattern F1 to the bottom surface of the second trench T2.

Based on the substrate 100, the height h12 to the bottom surface of the epitaxial layer 130 may be greater than the height h3 to the top surface of the field insulating film 110. That is, the top surface of the field insulating film 110 may be lower than a point in which the top surface of the field insulation film 110 and the fin-shaped pattern F1 are in contact with each other. In some aspects, the top surface of the field insulating film 110 may be formed to come closer to the top surface of the substrate 100, as it comes closer to the top surface of the fin-shaped pattern F1. In some aspects, a part of the epitaxial layer 130 may be located below the top surface of the field insulating film 110. However, the present disclosure is not limited thereto.

Figure 12:
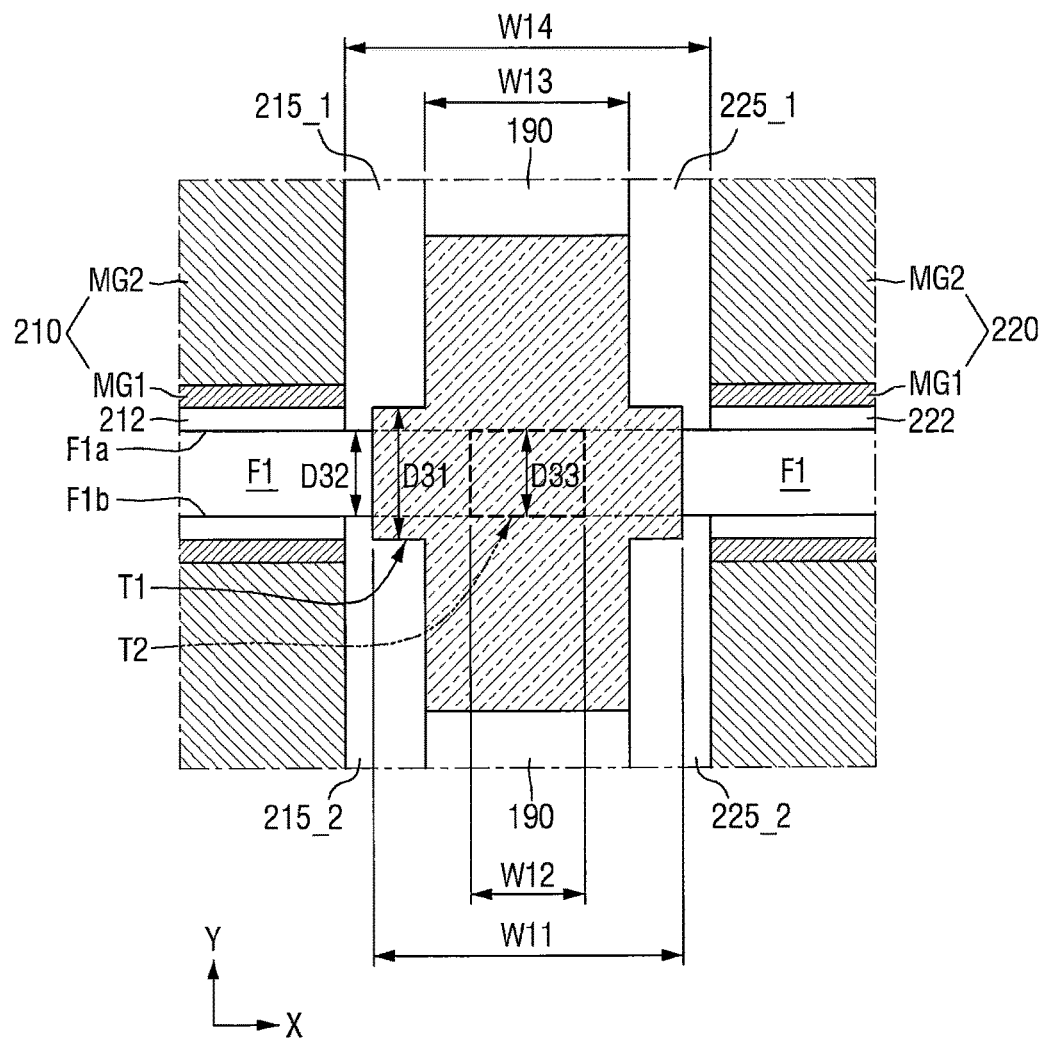
FIG. 12 is a layout diagram for explaining a semiconductor device according to aspects of the present disclosure.

FIG. 12 is a layout diagram for explaining a semiconductor device according to some aspects of the present disclosure. Hereinafter, for convenience of explanation, differences from those described with reference to FIGS. 1 to 4 will be mainly described.

FIG. 12 is a view illustrating the X-Y-plane to explain the cross-sections of the fin-shaped pattern F1, the first gate spacer 215 and the second gate spacer 225.

Referring to FIG. 12, according to some aspects of the present disclosure, the first gate spacer 215 of the semiconductor device may include a first sub-gate spacer 215_1 and a second sub-gate spacer 215_2.

The first sub-gate spacer 215_1 may be formed on the side wall of the first gate electrode 210 and is formed on the first side wall F1a of the fin-shaped pattern F1 so as to be in contact with a part of the first side wall F1a. The second sub-gate spacer 215_2 may be formed on the side wall of the first gate electrode 210 and is formed on the second side wall F1b of the fin-shaped pattern F1 so as to be in contact with a part of the second side wall F1b.

Similarly, the second gate spacer 225 may include a third sub-gate spacer 225_1 and a fourth sub-gate spacer 225_2. The third sub-gate spacer 225_1 may be formed on the side wall of the second gate electrode 220 and may be formed on the first side wall F1a of the fin-shaped pattern F1 so as to be in contact with a part of the first side wall F1a. The fourth sub-gate spacer 225_2 may be formed on the side wall of the second gate electrode 220 and is formed on the second side wall F1b of the fin-shaped pattern F1 so as to be in contact with a part of the second side wall F1b.

The first trench T1 may be formed between the first sub-gate spacer 215_1 and the second sub-gate spacer 215_2, and between the third sub-gate spacer 225_1 and the fourth sub-gate spacer 225_2.

In the process of forming the first trench T1, a part of the first gate spacer 215 and a part of the second gate spacer 225 which are in contact with the fin-shaped pattern F1 may be etched along with the fin-shaped pattern F1. As a result, in the region in which the first trench T1, the first gate spacer 215 and the second gate spacer 225 overlap one another, the interval of the first trench T1 may be expanded.

For example, a first interval D31 between the first sub-gate spacer 215_1 and the second sub-gate spacer 215_2 measured in the second direction Y may be formed to be greater than a second interval D 32 between the first side wall F1a and the second side wall F1b of the fin-shaped pattern F1 measured in the second direction Y within the same plane. Therefore, the thickness of the epitaxial layer 130 measured in the second direction Y may be formed to be greater than the thickness of the fin-shaped pattern F1 measured in the second direction Y.

In some aspects, the cross-section of the first sub-gate spacers 215_1 and the second sub-gate spacer 215_2 may have a stepped profile.

The first trench T1 may be formed between the first gate electrode 210 and the second gate electrode 220. More specifically, the first trench T1 may be formed between the first gate spacer 215 and the second gate spacer 225 facing each other.

The first trench T1 may be formed to have a first width W11. In some aspects, the first width W11 of the first trench T1 may be formed to be smaller than a width W14 between the side wall of the first gate electrode 210 and the side wall of the second gate electrode 220 facing each other, and to be greater than a width W13 between the outer wall of the first gate spacer 215 and the outer wall of the second gate spacer 225 facing each other.

The second trench T2 may be formed at the center of the first trench T1. The second trench T2 may be formed within the fin-shaped pattern F1. In some aspects, the second trench T2 may be formed to be deeper than the first trench T1, and the first trench T1 and the second trench T2 may form a stepped profile.

The second trench T2 may be formed to have a second width W12 that is smaller than the first width W11 of the first trench T1. Specifically, the second width W12 of the second trench T2 may be formed to be smaller than the width W13 between the outer wall of the first gate spacer 215 and the outer wall of the second gate spacer 225 facing each other.

A width D33 of the second trench T2 measured in the second direction Y may be formed to be equal to or greater than a second interval D32 between the first side wall F1a and the second side wall F1b of the fin-shaped pattern F1 measured in the second direction Y within the same plane. Further, the width D33 of the second trench T2 measured in the second direction Y may be smaller than the first interval D31 of the first trench T1 measured in the second direction Y within the same plane. However, the present disclosure is not limited thereto.

The epitaxial layer 130 is formed on the fin-shaped pattern F1 between the first gate electrode 210 and the second gate electrode 220. At this time, the epitaxial layer 130 may be integrally formed along the profiles of the first trench T1 and the second trench T2.

The cross-section of the epitaxial layer 130 measured in the second direction Y may be greater than the cross-section of the fin-shaped pattern F1. A part of the epitaxial layer 130 may be in contact with the fin-shaped pattern F1, and the cross-section of the fin-shaped pattern F1 being in contact with the epitaxial layer 130 may be formed to be greater than the cross-section of the fin-shaped pattern F1. The epitaxial layer 130 is formed between the first gate spacer 215 and the second gate spacer 225, and may be in contact with the outer surfaces of the first gate spacer 215 and the second gate spacer 225.

Accordingly, the profile of the secondary recess structure of the first trench T1 and the second trench T2 of the semiconductor device may minimize the overlap between the gate electrode and the epitaxial layer, and may secure a sufficient distance with the channel of the transistor, thereby improving the element characteristics.

Figure 13:
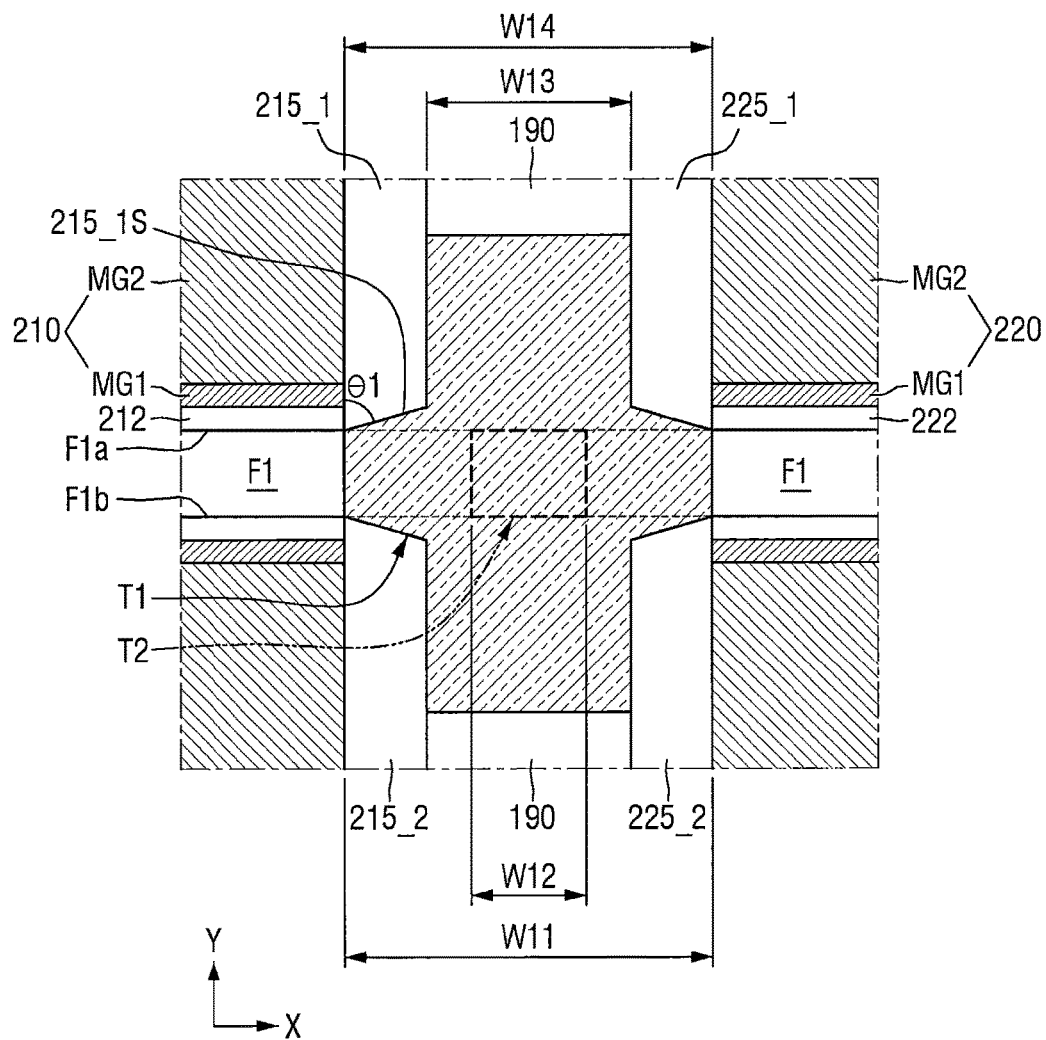
FIG. 13 is a layout diagram for explaining a semiconductor device according to aspects of the present disclosure.

FIG. 13 is a layout diagram for explaining a semiconductor device according to some aspects of the present disclosure. Hereinafter, for convenience of explanation, differences from those described with reference to FIGS. 1 to 12 will be mainly described.

Referring to FIG. 13, according to some aspects of the present disclosure, the cross-section of the first sub-gate spacer 215_1 or the second sub-gate spacer 215_2 may form an acute angle with the side wall of the first gate electrode 210. For example, a cross-section 215_1S of the first sub-gate spacer 215_1 and the side wall of the first gate electrode 210 has a first angle θ1. The first angle θ1 may be smaller than a right angle.

The second sub-gate spacer 215_2 may be disposed to be symmetrical with the first sub-gate spacer 215_1 based on the fin-shaped pattern F1.

Accordingly, the thickness of the epitaxial layer 130 measured in the second direction Y may decrease as it comes closer to the fin-shaped pattern F1. Similarly, the distance between the first sub-gate spacer 215_1 and the second sub-gate spacer 215_2 may decrease as it comes closer to the fin-shaped pattern F1.

Although it is not clearly illustrated in the drawings, the shortest interval between the first sub-gate spacer 215_1 and the second sub-gate spacer 215_2 may be greater than a second interval between the first side wall F1a and the second side wall F1b of the fin-shaped pattern F1 measured in the second direction Y within the same plane. However, the present disclosure is not limited thereto.

Figure 14:
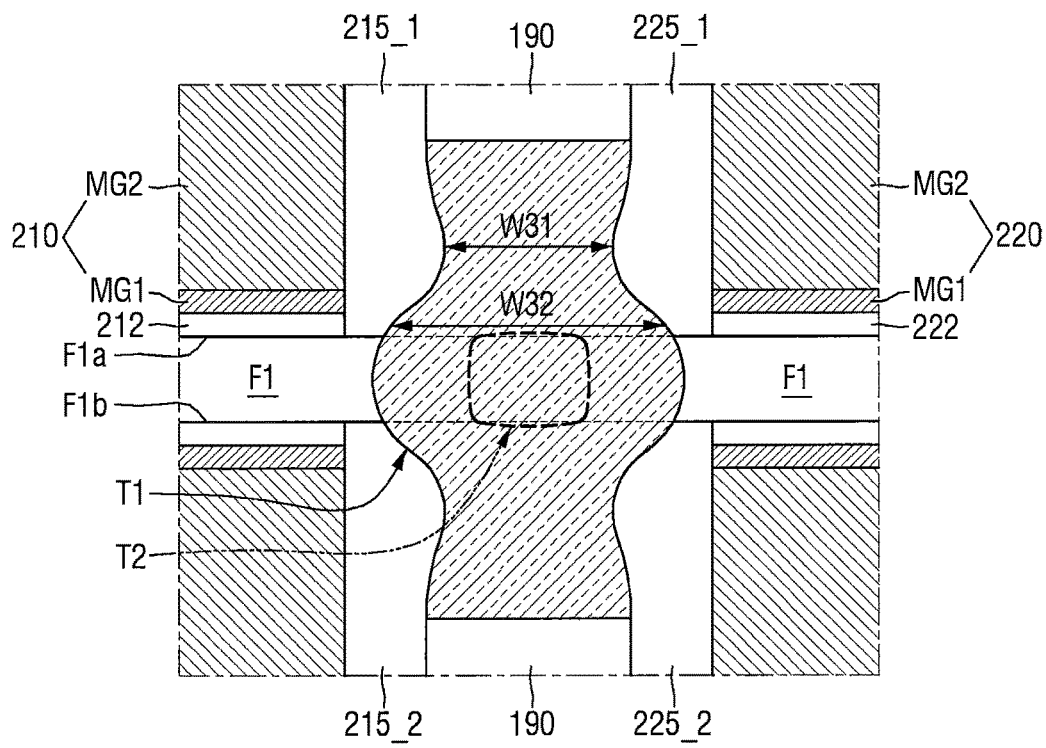
FIG. 14 is a layout diagram for explaining a semiconductor device according to aspects of the present disclosure.

FIG. 14 is a layout diagram for explaining a semiconductor device according to some aspects of the present disclosure. Hereinafter, for convenience of explanation, differences from those described with reference to FIGS. 1 to 12 will be mainly described.

Referring to FIG. 14, according to some aspects of the present disclosure, the outer surface of the first gate spacer 215 and the outer surface of the second gate spacer 225 may have a curved surface profile. Thus, the first trench T1 and the second trench T2 may have a profile of the convex curved surface, and part of the cross-section of the fin-shaped pattern F may also have a profile of a concave curved surface.

At this time, the second trench T2 is formed at the center of the first trench T1, and may have a circular or oval cross-section.

A part of the first sub-gate spacer 215_1 of the first gate spacer 215 may have the thickness that becomes thinner as it comes closer to the fin-shaped pattern F1. The first sub-gate spacer 215_1 and the second sub-gate spacer 215_2 may be formed to be symmetrical based on the fin-shaped pattern F1. Further, the first gate spacer 215 and the second gate spacer 225 may be formed to be symmetrical based on the second trench T2.

Accordingly, the distance between the first gate spacer 215 and the second gate spacer 225 decreases as it comes closer to the fin-shaped pattern F1. For example, the second distance W32 between the first gate spacer 215 and the second gate spacer 225 measured at a position near the fin-shaped pattern F1 may be greater than the first distance W31 between the first gate spacer 215 and the second gate spacer 225 measured at a position distant from the fin-shaped pattern F1. However, the present disclosure is not limited thereto.

While aspects of the present disclosure have been particularly shown and described with reference to exemplary embodiments thereof, it will be understood by those of ordinary skill in the art that various changes in form and details may be made therein without departing from the scope of the present disclosure as defined by the following claims. It is therefore desired that the present disclosure be considered in all respects as illustrative and not restrictive, reference being made to the appended claims rather than the foregoing description to indicate the scope of what is being claimed.

What is claimed is:

1. A semiconductor device comprising:
a fin-shaped pattern that extends in a first direction and comprises a first side wall and a second side wall facing each other;
a first gate electrode and a second gate electrode that extend in a second direction different from the first direction and are spaced apart from each other;
a first gate spacer on a side wall of the first gate electrode;
a second gate spacer on a side wall of the second gate electrode;
a first trench in the fin-shaped pattern between the first gate electrode and the second gate electrode, the first trench having a first width; and
a second trench in the fin-shaped pattern and below the first trench, the second trench having a second width smaller than the first width,
wherein the fm-shaped pattern comprises a first inflection point on the first side wall of the fin-shaped pattern, and a second inflection point on the second side wall of the fin-shaped pattern,
wherein a bottom surface of the second trench is lower than the first and second inflection points, and
wherein a bottom surface of an epitaxial layer in the second trench is lower than a top surface of a field insulating film of the semiconductor device.

2. The semiconductor device of claim 1, wherein the second width of the second trench is smaller than a width between an outer wall of the first gate spacer and an outer wall of the second gate spacer.

3. The semiconductor device of claim 2, wherein the first width of the first trench is smaller than a width between the side wall of the first gate electrode and the side wall of the second gate electrode, and
wherein the first width of the first trench is greater than the width between the outer wall of the first gate spacer and the outer wall of the second gate spacer.

4. The semiconductor device of claim 3, wherein the epitaxial layer is in the first trench, and wherein the first width of the first trench is greater than a width of a topmost surface of the epitaxial layer in the first trench.

5. The semiconductor device of claim 1, wherein the first and second inflection points are located on the same plane as a bottom surface of the first trench.

6. The semiconductor device of claim 1, wherein a first depth from a top surface of the fin-shaped pattern to a bottom surface the second trench is greater than a second depth from the top surface of the fin-shaped pattern to a bottom surface of the first trench.

7. The semiconductor device of claim 1, further comprising:
the field insulating film that covers a side surface of the fin-shaped pattern,
wherein the top surface of the field insulating film is higher than the bottom surface of the second trench.

8. The semiconductor device of claim 7, wherein the epitaxial layer is in the first trench, and wherein the top surface of the field insulating film is lower than a top surface of the epitaxial layer in the first trench.

9. The semiconductor device of claim 1, further comprising:
the field insulating film that covers a side surface of the fin-shaped pattern,
wherein the top surface of the field insulating film is lower than the bottom surface of the first trench.

10. A semiconductor device comprising:
a fin-shaped pattern extending in a first direction and comprising a first side wall and a second side wall;
a first gate electrode and a second gate electrode extending in a second direction different from the first direction and spaced apart from each other;
a first gate spacer on a side wall of the first gate electrode;
a second gate spacer on a side wall of the second gate electrode;
a trench in the fin-shaped pattern between the first gate electrode and the second gate electrode, the trench having a stepped profile; and
a field insulating film that covers a side surface of the fin-shaped pattern,
wherein the trench comprises a first portion having a first width and a second portion below the first portion having a second width smaller than the first width,
wherein the fin-shaped pattern comprises a first inflection point on the first side wall of the fin-shaped pattern, and a second inflection point on the second side wall of the fin-shaped pattern,
wherein a bottom surface of the second portion of the trench is lower than the first and second inflection points, and
wherein a top surface of the field insulating film is higher than a top surface of an epitaxial layer that is in the second portion of the trench.

11. The semiconductor device of claim 10, wherein the field insulating film comprises one of an oxide film, a nitride film, an oxynitride film or a combination thereof.

12. The semiconductor device of claim 10, wherein the first portion decreases in width from the first width at a bottom surface of the first portion to another width of the first portion at a topmost surface of fin-shaped pattern.

13. The semiconductor device of claim 10, further comprising an interlayer insulating film between the first gate spacer and the second gate spacer.

* * * * *